(12) United States Patent
Liu et al.

(10) Patent No.: US 11,362,663 B2
(45) Date of Patent: Jun. 14, 2022

(54) QUANTUM PULSE DETERMINING METHOD, APPARATUS, DEVICE AND READABLE STORAGE MEDIUM

(71) Applicant: Beijing Baidu Netcom Science Technology Co., Ltd., Beijing (CN)

(72) Inventors: Shusen Liu, Beijing (CN); Runyao Duan, Beijing (CN)

(73) Assignee: BEIJING BAIDU NETCOM SCIENCE TECHNOLOGY CO., LTD.

( * ) Notice: Subject to any disclaimer, the term of this patent is extended or adjusted under 35 U.S.C. 154(b) by 85 days.

(21) Appl. No.: 17/021,055

(22) Filed: Sep. 15, 2020

(65) Prior Publication Data

US 2021/0194487 A1    Jun. 24, 2021

(30) Foreign Application Priority Data

Feb. 10, 2020  (CN) .......................... 202010085055.2

(51) Int. Cl.
*H03K 19/195*  (2006.01)
*G06N 10/00*  (2022.01)
*H03K 3/38*  (2006.01)

(52) U.S. Cl.
CPC ........... *H03K 19/195* (2013.01); *G06N 10/00* (2019.01); *H03K 3/38* (2013.01)

(58) Field of Classification Search
CPC ......... H03K 19/195; H03K 3/38; G06N 10/00
(Continued)

(56) References Cited

U.S. PATENT DOCUMENTS 10,454,459 B1 * 10/2019 Cohen ...................... H03K 3/38
10,726,351 B1 *  7/2020 Li ....................... H03K 19/1958
(Continued)

FOREIGN PATENT DOCUMENTS

CN          101118608 A      2/2008
CN          109165741 A      1/2019
(Continued)

OTHER PUBLICATIONS

First Office Action in CN Patent Application No. 202010085055.2 dated Jun. 28, 2021.
(Continued)

*Primary Examiner* — Don P Le
(74) *Attorney, Agent, or Firm* — Dilworth IP, LLC (57) ABSTRACT

Provided are a quantum pulse determining method, apparatus, device and readable storage medium, where basic pulses corresponding to basic logic gates are set in advance, the method including: when manipulating a qubit according to a quantum logic gate, splitting the quantum logic gate to obtain sub-logic gates; and searching for sub-pulses corresponding to the sub-logic gates among the basic pulses, and manipulating the qubit according to the sub-pulse. Basic pulses are set in advance in the method, apparatus, device and readable storage medium provided by the embodiments. When a qubit is to be manipulated, the quantum logic gate can be split into multiple sub-logic gates, and then sub-pulses corresponding to the sub-logic gates are searched for among the basic pulses. Thus, sub-pulses read can be used directly to manipulate the qubit, avoiding the computing power consumed in generating pulses according to the quantum logic gate, thereby improving an operation speed.

20 Claims, 5 Drawing Sheets

(58) Field of Classification Search
USPC .......................................................... 326/1
See application file for complete search history.

(56) References Cited

U.S. PATENT DOCUMENTS

| | | | |
|---|---|---|---|
| 10,769,344 B1* | 9/2020 | Schneider | H03K 19/1952 |
| 2003/0121028 A1 | 6/2003 | Coury et al. | |
| 2019/0049495 A1 | 2/2019 | Ofek et al. | |
| 2021/0036692 A1* | 2/2021 | Cohen | H03K 3/38 |
| 2021/0067146 A1* | 3/2021 | Cohen | H03K 3/38 |
| 2021/0152189 A1* | 5/2021 | Murali | G06N 3/0454 |

FOREIGN PATENT DOCUMENTS

| | | |
|---|---|---|
| CN | 109165744 A | 1/2019 |
| CN | 109409526 A | 3/2019 |
| CN | 110516811 A | 11/2019 |
| JP | 2006331249 A | 12/2006 |
| WO | 2018177577 A1 | 10/2018 |

OTHER PUBLICATIONS

Rrowland, B. et al., 'Implementing quantum logic gates with gradient ascent pulse engineering: principles and practicalities', Philosophical Transactions of the Royal Society A, 2012, pp. 4636-4650.

Slepoy, Alexander, Quantum Gate Decomposition Algorithms, Sandia National Laboratories, 2006, pp. 1-12.

Jones, J. A. et al., 'Implementation of a Quantum Algorithm to Solve Deutsch's Problem on a Nuclear Magnetic Resonance Quantum Computer', arXive, 1998 <URL: https://arxiv.org/pdf/quant-ph/9801027.pdf>, pp. 1-13.

First Office Action, Examination Report, in AU Patent Application No. 2020233743 dated Feb. 26, 2021.

* cited by examiner

QUANTUM PULSE DETERMINING METHOD, APPARATUS, DEVICE AND READABLE STORAGE MEDIUM

CROSS-REFERENCE TO RELATED APPLICATIONS

This application claims priority to Chinese Patent Application No. 202010085055.2, filed on Feb. 10, 2020, which is hereby incorporated by reference in its entirety.

TECHNICAL FIELD

The present disclosure relates to computer technologies, and in particular, to quantum computing systems.

BACKGROUND

In quantum computers, it is necessary to adjust a state of a qubit to make the qubit carry information.

The qubit can be in a 0, a 1 or a superposition state, and the state of the qubit can be changed, e.g., changing from |0> to |1>, by applying a pulse to the qubit.

Specifically, a pulse can be applied to the qubit through a quantum logic gate (a unitary transformation, $U_{target}$). For example, when the qubit is manipulated via the $U_{target}$, the pulse generated based on the $U_{target}$ can be used and applied to the qubit to change the state of the qubit.

However, when a quantum computing system is complex in logic and has a large amount of data, the pulse corresponding to the $U_{target}$ generated in real time based on the method in the prior art will lead to a slow running speed of the quantum computing system.

SUMMARY

The present disclosure provides a quantum pulse determining method, apparatus, device and readable storage medium for improving an operation speed of a quantum computing system.

A first aspect of the present disclosure provides a quantum pulse determining method, in which basic pulses corresponding to basic logic gates are set in advance;

the method including:
when manipulating a qubit according to a quantum logic gate, splitting the quantum logic gate to obtain sub-logic gates; and
searching for sub-pulses corresponding to the sub-logic gates among the basic pulses, and manipulating the qubit according to the sub-pulses.

In an optional implementation, the searching for sub-pulses corresponding to the sub-logic gates among the basic pulses, includes:
for each of the sub-logic gates, searching for a basic logic gate corresponding to the sub-logic gate, and determining a basic pulse corresponding to the basic logic gate to be the sub-pulse corresponding to the sub-logic gate.

In the optional implementation, the sub-pulses corresponding to the sub-logic gates can be directly found in the basic pulses through a corresponding relationship between logic gates without generating the sub-pulses, thereby avoiding computing power consumed due to pulse generation.

In an optional implementation, the basic pulse has a preset identifier; and
the searching for sub-pulses corresponding to the sub-logic gates among the basic pulses includes:
for each of the sub-logic gates, determining a search identifier according to the sub-logic gate, and searching for a sub-pulse having the search identifier among the basic pulses.

In the optional implementation, the sub-pulses corresponding to the sub-logic gates can be directly found among the basic pulses using the identifiers without generating the sub-pulses, thereby avoiding computing power consumed due to the pulse generation.

In an optional implementation, the preset identifier is determined according to a hash value generated according to matrix elements included in a representation matrix of a basic logic gate corresponding to the preset identifier;
correspondingly, the determining a search identifier according to the sub-logic gate includes:
determining matrix elements according to a representation matrix of the sub-logic gate, generating a hash value according to the matrix elements, and determining the hash value to be the search identifier.

In the optional implementation, a corresponding hash value is generated through the logic gate, and the hash value is used as an identifier to ensure that the generated identifier is unique.

In an optional implementation, when a quantum computing system is a nuclear magnetic resonance quantum system, the splitting the quantum logic gate to obtain sub-logic gates includes:
splitting the quantum logic gate, based on a rotation decomposition algorithm, into sub-logic gates: a first coordinate axis sub-gate, a second coordinate axis sub-gate and a third coordinate axis sub-gate.

In an optional implementation, representation matrices of the first coordinate axis sub-gate, the second coordinate axis sub-gate and the third coordinate axis sub-gate are functions of a variable θ;
when no sub-pulses corresponding to the sub-logic gates is found, adjusting the variable θ, and continuing to execute a step of the searching for sub-pulses corresponding to the sub-logic gates among the basic pulses.

In an optional implementation, a representation matrix of a basic logic gate includes any one of the following:
a component matrix for a first coordinate axis, a component matrix for a second coordinate axis, and a component matrix for a third coordinate axis, where directions of the first coordinate axis, the second coordinate axis, and the third coordinate axis are perpendicular to each other.

In the implementation, the quantum logic gate in the nuclear magnetic resonance quantum system can be split, so that when the qubit is manipulated according to the quantum logic gate in the nuclear magnetic resonance quantum system, a corresponding pulse of the quantum logic gate can be determined by reading, rather than generating, the corresponding pulse, thereby avoiding the computing power consumed due to the pulse generation.

In an optional implementation, when a quantum computing system is a superconducting quantum system, the splitting the quantum logic gate to obtain sub-logic gates including:
converting the quantum logic gate into a permutation and combination of multiple general logic gates based on a preset algorithm;
utilizing at least one of the basic logic gates to replace the permutation and combination of the multiple general logic gates to obtain the sub-logic gates.

In an optional implementation, the preset algorithm is a single bit decomposition algorithm.

In an optional implementation, further including:

generating general pulses corresponding to the general logic gates in advance;

obtaining the basic logic gates by permutating and combining the general logic gates, and generating the basic pulses corresponding to the basic logic gates according to the general pulses corresponding to the general logic gates.

In the implementation, the quantum logic gate in the superconducting quantum system can be split, so that when the qubit is manipulated according to the quantum logic gate in the superconducting quantum system, a corresponding pulse of the quantum logic gate can be determined by reading, rather than generating, the corresponding pulse, thereby avoiding the computing power consumed due to the pulse generation.

In an optional implementation, before the splitting the quantum logic gate to obtain sub-logic gates, the implementation further includes:

searching for a target pulse corresponding to the quantum logic gate among the basic pulses, and when no hit is found, executing the step of splitting the quantum logic gate to obtain sub-logic gates.

In the optional implementation, when the quantum logic gate corresponds to a basic logic gate, the basic pulse of the basic logic gate can be read directly without performing the splitting step, thus further improving system operation speed.

In an optional implementation, a multi-level memory is provided; and a data processing speed of each level of the memory is different; and when searching for sub-pulses corresponding to the sub-logic gates among basic pulses, reading the sub-pulses from the multi-level memory in an order of the data processing speed from fast to slow.

The multi-level memory includes a slow memory, a medium-speed memory and a fast memory; the slow memory stores basic pulses corresponding to all of the basic logic gates; and the reading the sub-pulses from the multi-level memory in an order of the data processing speed from fast to slow includes:

searching for the sub-pulses in the fast memory;

when no hit is found in the fast memory, searching for the sub-pulses in the medium-speed memory; and when no hit is found in the medium-speed memory, searching for the sub-pulses in the slow memory.

In an optional implementation, further including:

when a hit is found for the sub-pulses in the slow memory, storing the sub-pulses in the medium-speed memory;

when a hit is found for the sub-pulses in the medium-speed memory, storing the sub-pulses in the fast memory.

In the optional implementation, the pulses with a greater probability of being read can be stored in the fast memory, so that required pulses can be read quicker, thus further improving the calculation speed of a quantum system.

A second aspect of the present disclosure provides a quantum pulse determining apparatus, which is provided with basic pulses corresponding to basic logic gates in advance;

the apparatus includes:

a splitting module, configured to split a quantum logic gate to obtain sub-logic gates when a qubit is manipulated according to the quantum logic gate;

a searching module, configured to search for sub-pulses corresponding to the sub-logic gates among the basic pulses, and manipulate the qubit according to the sub-pulses.

A third aspect of the present disclosure provides an electronic device, including:

at least one processor; and a memory connected in communication with the at least one processor; where, the memory stores instructions that are executable by the at least one processor, and the instructions are executed by the at least one processor to cause the at least one processor to execute the quantum pulse determining method as described in any one of the implementations as described in the first aspect.

A fourth aspect of the present disclosure provides a non-transitory computer-readable storage medium storing computer instructions, the computer instructions are used to cause a computer to execute the quantum pulse determining method according to any one of the implementations as described in the first aspect.

According to the quantum pulse determining method, apparatus, device and readable storage medium provided by the present disclosure, basic pulses corresponding to basic logic gates are set in advance, the method including: when manipulating a qubit according to a quantum logic gate, splitting the quantum logic gate to obtain sub-logic gates; and searching for sub-pulses corresponding to the sub-logic gates among the basic pulses, and manipulating the qubit according to the sub-pulses. According to the quantum pulse determining method, apparatus, device and readable storage medium provided by the present disclosure, and in the method, apparatus, device and readable storage medium provided by the embodiments, basic pulses are set in advance, and when manipulating the qubit, the quantum logic gate to be used can be split into multiple sub-logic gates, and then sub-pulses corresponding to the sub-logic gates can be searched for among the basic pulses. Thus, sub-pulses that are read can be directly used to manipulate the qubit, which can avoid the computing power consumed in generating pulses according to the quantum logic gate, thereby improving an operation speed of the quantum computing system.

BRIEF DESCRIPTION OF DRAWINGS

The accompanying drawings are used to better understand the solution, and do not constitute any limitation on the present application. In the drawings.

DESCRIPTION OF EMBODIMENTS

The following describes illustrative embodiments of the present application in combination with the accompanying drawings, which includes various details of embodiments of the present application to facilitate understanding, and they should be considered as merely illustrative. Therefore, those of ordinary skill in the art should recognize that various changes and modifications can be made to the embodiments described herein without departing from the scope and spirit of the present application. Also, for clarity and conciseness, descriptions of well-known functions and structures are omitted in the following description.

In quantum computing, pulse computing systems encode information onto qubits, and manipulation of qubit states can be achieved through quantum logic gates. The quantum logic gates are usually implemented by applying electromagnetic waves to qubits, and the electromagnetic waves with specific waveforms are called pulses.

Figure 1:
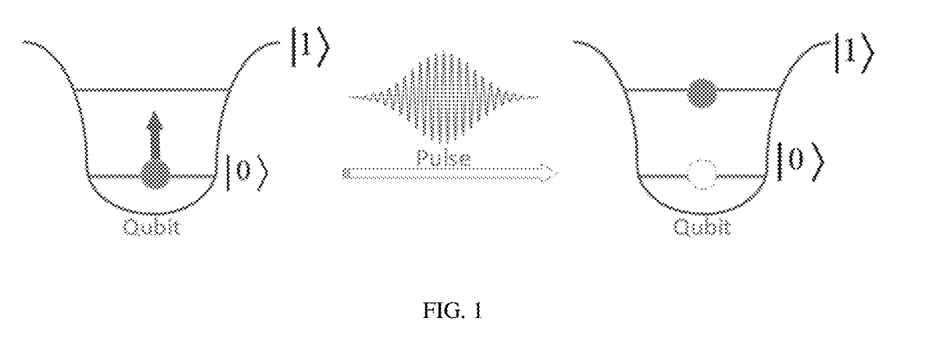
FIG. 1 is a state change diagram of a qubit shown in an illustrative embodiment.

FIG. 1 is a state change diagram of a qubit shown in an illustrative embodiment.

As shown in FIG. 1, the qubit can be changed from $|0\rangle$ to $|1\rangle$ by applying an appropriate pulse. Under an action of the pulse, a quantum state can also reach any other state.

A quantum logic gate U acting on the qubit satisfies: $\dot{U}=-iH(t)U(t)$, and $U(0)=I$, where t is a time to realize a quantum gate, H(t) is a time-evolved Hamiltonian of the qubit, and I is an identity matrix. Generally speaking, H(t) is composed of two parts:

$$H(t)=H_0+H_{drive}(t)$$

where $H_0$ is a free Hamiltonian of the qubit, which is determined by a character of the qubit itself. $H_{drive}(t)$ is called a driving Hamiltonian, which is a product of a driving pulse amplitude and a corresponding control operator acting on the qubit. Generally speaking, pulses from multiple channels are required to drive the qubit simultaneously in order to realize an arbitrary quantum pulse. Assuming that the driving pulse amplitude on a $k^{th}$ channel for driving the qubit is $B_k(t)$, and a form of the control operator acting on the qubit is $\mathcal{O}_{drive,k}$, then the $H_{drive}(t)$ may be represented as:

$$H_{drive}(t) = \sum_k B_k(i) \mathcal{O}_{drive,k}$$

Generally, according to the Jaynes-Cummings model, a coupling between a driving pulse and the qubit satisfies a dipole coupling, so $\mathcal{O}_{drive,k}$ is usually some Pauli operators or a tensor product of the Pauli operators, the specific form depending on the particular quantum computing platform.

When the form of the control operator $\mathcal{O}_{drive,k}$ is known, the key to realize an arbitrary quantum logic gate U for the qubit is to solve for each channel the driving pulse amplitude $B_k(t)$. The quantum pulse system has the ability of calculating the $B_k(t)$ corresponding to a high-fidelity logic gate efficiently.

At present, both NMR (Nuclear Magnetic Resonance, NMR) quantum systems and superconducting quantum systems need pulse computing to bridge the hardware and software. This is especially true for superconducting quantum systems because the Hamiltonian $H_0$ for the hardware is difficult to describe stably and precisely, not only the pulses need to be provided online, but also a corrected pulse sequence needs to be generated and stored according to a manual calibration and correction method when offline, to be extracted in time when a computing task arrives.

However, in the case of complex logic and large amount of data, it will take a lot of computing resources to generate corresponding pulses of quantum logic gates, which leads to a decline in running speed of the quantum computing system.

In the solution provided by the present application, some basic pulses corresponding to basic logic gates are set in advance. When a qubit needs to be manipulated according to a quantum logic gate, the quantum logic gate is split to obtain sub-logic gates, sub-pulses corresponding to the sub-logic gates are found among the pre-set basic pulses, and then the logic gate is manipulated according to the pre-set sub-pulses. The method can omit the tedious and complicated step of pulse calculation. Instead, pre-existing pulses are directly used to manipulate the qubit, without the need for too much computing resources to generate pulses corresponding to the quantum logic gate, thereby enabling improvement in the running speed of the quantum computing system as a whole.

Figure 2:
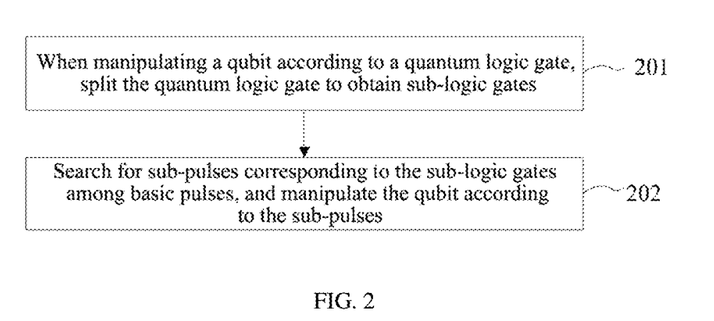
FIG. 2 is a flowchart of a quantum pulse determining method shown in an illustrative embodiment of the present application.

FIG. 2 is a flowchart of a quantum pulse determining method shown in an illustrative embodiment of the present application.

As shown in FIG. 2, a quantum pulse determining method provided by the present application includes the following.

Step 201, when manipulating a qubit according to a quantum logic gate, split the quantum logic gate to obtain sub-logic gates.

The method provided in the present embodiment may be executed by an electronic device with computing capability, such as a quantum computing system, a quantum computing platform or the like.

Specifically, basic pulses corresponding to basic logic gates are set in advance in the electronic device. These basic pulses can be generated according to any method in the prior art.

If the electronic device is a nuclear magnetic resonance (NMR) quantum system, frequently used basic pulses can be prepared in advance and stored. For example, a representation matrix of a basic logic gate may be set to M (a quantum logic gate is usually represented by a matrix), where M can include a component matrix for a first coordinate axis, a component matrix for a second coordinate axis, and a component matrix for a third coordinate axis, and directions of the first coordinate axis, the second coordinate axis and the third coordinate axis are perpendicular to each other. For example, $M=Rx(\theta)$, $M=Ry(\theta)$, $M=Rz(\theta)$, $\theta \in \{k/N, k=1, 2, 3 \ldots\}$, N is a preset value that is sufficiently large, such as 3600. It is also possible to set representation matrices for frequently used two-bit gates CNOT (Control Overturn Gate) and CZ (Control Phase Gate). Pulses corresponding to these matrices can be generated, that is, the basic pulses corresponding to the basic logic gates can be generated, where the specific generation method can adopt the prior art, and the basic pulses can be stored. For example, they may be stored in a hard disk of the electronic device, where, $$Rx(\theta) = \begin{bmatrix} \cos(\theta/2) & -i\sin(\theta/2) \\ -i\sin(\theta/2) & \cos(\theta/2) \end{bmatrix};$$

-continued $$Ry(\theta) = \begin{bmatrix} \cos(\theta/2) & -\sin(\theta/2) \\ \sin(\theta/2) & \cos(\theta/2) \end{bmatrix};$$

$$Rz(\theta) = \begin{bmatrix} e^{-i\theta/2} & 0 \\ 0 & e^{-i\theta/2} \end{bmatrix};$$

$$CNOT = \begin{bmatrix} 1 & 0 & 0 & 0 \\ 0 & 1 & 0 & 0 \\ 0 & 0 & 0 & 1 \\ 0 & 0 & 1 & 0 \end{bmatrix};$$

$$CZ = \begin{bmatrix} 1 & 0 & 0 & 0 \\ 0 & 1 & 0 & 0 \\ 0 & 0 & 1 & 0 \\ 0 & 0 & 0 & -1 \end{bmatrix}.$$

If the electronic device is a superconducting quantum computing system, multiple frequently used basic pulses can be prepared in advance and stored. For example, a set of quantum gates may be pre-selected, which may include three general logic gates H, S, and T. A basic pulse corresponding to a general logic gate can be generated. A variety of basic logic gates M are obtained by permutation and combination of general logic gates. For example, a definition may be M=H, M=S, M=T, M=HS, M=HT, etc. The basic logic gate M can be obtained by permutation and combination of n general logic gates. Correspondingly, pulses of the general logic gates can be arranged and combined to obtain a corresponding pulse of the basic logic gate M. The n can be, for example, 1, 2, . . . 16 and other values. The pulse of the basic logic gate M can be stored, for example, in the hard disk of the electronic device, where, $$H = \frac{1}{\sqrt{2}}\begin{bmatrix} 1 & 1 \\ 1 & -1 \end{bmatrix}; S = \begin{bmatrix} 1 & 0 \\ 0 & i \end{bmatrix}; T = \begin{bmatrix} 1 & 0 \\ 0 & e^{i\pi/4} \end{bmatrix}.$$

Specifically, for storage, an identifier 'key' can also be generated according to a logic gate M, and the basic pulse corresponding to the basic logic gate M is taken as a 'value', so as to store the basic pulse in a form of a key-value pair.

Further, a hash value can be generated according to the basic logic gate M. For example, each element in the representation matrix M of the basic logic gate can be stored using IEEE 754, and a hash value can be determined according to the first 32 bits in the stored result. Taking the hash as the key, the basic pulse corresponding to the basic logic gate is taken as the value corresponding to the key.

In practical applications, when a qubit is to be manipulated according to a quantum logic gate, the quantum logic gate can be split into multiple sub-logic gates. Specifically, it can be split into sub-logic gates consistent with any one of the basic logic gates.

For example, when the quantum computing system is a nuclear magnetic resonance quantum system, the quantum logic gate can be split into Rx(θ), Ry(θ), and Rz(θ). When the quantum computing system is a superconducting quantum system, a given quantum logic gate can be replaced by a combination of basic logic gates.

Step 202: Search for sub-pulses corresponding to the sub-logic gates among basic pulses, and manipulate the qubit according to the sub-pulses.

Since basic pulses corresponding to the basic logic gates have been generated in advance, the sub-pulses matching with the sub-logic gates can be found directly among the basic pulses after the quantum logic gate is split into the sub-logic gates.

Specifically, a basic pulse corresponding to a basic logic gate that is consistent with a sub-logic gate can be taken as the sub-pulse corresponding to the sub-logic gate. The process only involves reading data directly, without consuming too much computing capacity. For example, if the sub-logic gate M1 is obtained by the splitting and the pulse 'pulse1' corresponding to the basic logic gate M1 has been stored in advance, the pulse1 can be directly taken as the sub-pulse corresponding to the sub-logic gate M1.

Further, the sub-pulses can be spliced to obtain a target pulse, and then the target pulse can be utilized to manipulate the qubit that needs to be controlled, so as to change the qubit to a desired state. Since individual sub-logic gates are obtained by splitting an original quantum logic gate, then a target pulse corresponding to the original quantum logic gate can be obtained by splicing the sub-pulses corresponding to the sub-logic gates by following certain rules. Therefore, the qubit can be changed into a desired state by manipulating the qubit with the target pulse.

In practical applications, a qubit may be manipulated by using the sub-pulses corresponding to the sub-logic gates sequentially according to an order of the sub-logic gates. That is, pulses of the sub-logic gates can be applied to the qubit to change its state. Since the sub-logic gates are obtained by splitting the original quantum logic gate, manipulations corresponding to individual sub-logic gates can be superimposed on a qubit to change the qubit into a desired state.

Moreover, in the above process, a calculation process of generating a pulse according to the quantum logic gate is not required, and the calculation load of the quantum computing system can be reduced greatly.

The method provided in the embodiment is used to determine quantum pulses. The method is executed by a device provided with the method according to the embodiment, and the device is usually implemented in the form of hardware and/or software.

According to the quantum pulse determining method provided by the present embodiment, basic pulses corresponding to basic logic gates are set in advance, the method including: when manipulating a qubit according to a quantum logic gate, splitting the quantum logic gate to obtain sub-logic gates; and searching among the basic pulses for sub-pulses corresponding to the sub-logic gates, and manipulating the qubit according to the sub-pulses. In the quantum pulse determining method provided by the present embodiment, the basic pulses are set in advance. When the qubit is manipulated, the quantum logic gate to be used can be split into multiple sub-logic gates, and then sub-pulses corresponding to the sub-logic gates can be found among the basic pulses. Thus, the read sub-pulses can be used directly to manipulate the qubit, thus avoiding the computing power consumed in generating the pulse according to the quantum logic gate, thereby improving the operation speed of the quantum computing system.

Figure 3:
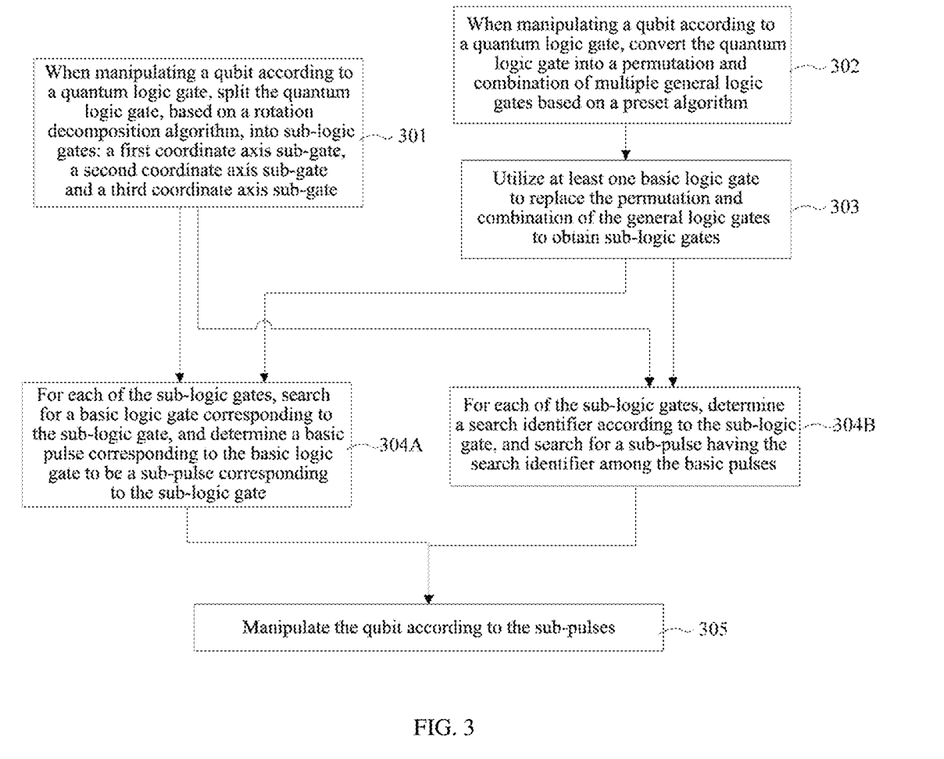
FIG. 3 is a flowchart of a quantum pulse determining method shown in another illustrative embodiment of the present application.

FIG. 3 is a flowchart of a quantum pulse determining method shown in another illustrative embodiment of the present application.

As shown in FIG. 3, the quantum pulse determining method provided by the present embodiment includes:

Step 301: When manipulating a qubit according to a quantum logic gate, split the quantum logic gate, based on a rotation decomposition algorithm, into sub-logic gates: a first coordinate axis sub-gate, a second coordinate axis sub-gate and a third coordinate axis sub-gate.

The method provided by the present embodiment can be executed by an electronic device with computing capability, such as a quantum computing system, a quantum computing platform or the like.

If the electronic device is implemented in a nuclear magnetic resonance quantum system, step 301 may be executed.

When a qubit is to be manipulated based on a quantum logic gate $U_{target}$, the quantum logic gate $U_{target}$ can be rotated around a first coordinate axis, a second coordinate axis, and a third coordinate axis based on the rotation decomposition algorithm to obtain sub-logic gates corresponding to the three coordinate axes. For example, rotations around the three axes, i.e., x, y, and z, produce an x-axis sub-gate $U_{target}^x$ in the x-axis direction, a y-axis sub-gate $U_{target}^y$ in the y-axis direction, and a z-axis sub-gate $U_{target}^z$ in the z-axis direction.

Directions of the first coordinate axis, the second coordinate axis, and the third coordinate axis are perpendicular to each other. For example, a coordinate system composed of x, y, and z axes, or a new coordinate system obtained by rotating the previous coordinate system, can also be applied to the solution of the present application.

Specifically, representation matrices of the first coordinate axis sub-gate, the second coordinate axis sub-gate, and the third coordinate axis sub-gate are each a function of a variable θ, and the three sub-gates can be stacked to obtain the quantum logic gate $U_{target}$.

After Step 301, Step 304A or Step 304B may be executed.

Step 302: When manipulating a qubit according to a quantum logic gate, convert the quantum logic gate into a permutation and combination of multiple general logic gates based on a preset algorithm.

The method provided by the present embodiment can be executed by an electronic device with computing capability, such as a quantum computing system, a quantum computing platform or the like.

If the electronic device is implemented in a superconducting quantum system, Step 302 may be executed.

In a superconducting quantum system, when a qubit is to be manipulated according to the quantum logic gate, the quantum logic gate can be converted into a permutation and combination of multiple general logic gates based on a preset algorithm. For example, the quantum logic gate can be processed based on a single-bit decomposition algorithm. The single-bit decomposition algorithm includes a class of algorithms, such as the SK (Solovay-Kitaev) algorithm.

Specifically, general logic gates may include, for example, H, T, S or the like. For example, a quantum logic gate $U_{target}$ can be converted into the permutation and combination of general logic gates, e.g., {HSHHHSSTTT . . . }.

Step 303: Utilize at least one basic logic gate to replace the permutation and combination of the general logic gates to obtain sub-logic gates.

Further, in the method provided by the embodiment, some basic logic gates can be prepared in advance. For a superconducting quantum system, the basic logic gates are composed of general logic gates. For example, the general logic gates can be permutated and combined to obtain a variety of basic logic gates M. For example, M=H, M=S, M=T, M=HS, M=HT, n general logic gates can be permutated and combined to obtain the basic logic gates M. Correspondingly, the pulses of the general logic gates can be permutated and combined to obtain a pulse corresponding to a basic logic gate M. The n can be, for example, 1, 2, . . . 16.

Specifically, the basic logic gates prepared by the above method can also be the permutation and combination of general logic gates, except that the number of general logic gates included in a basic logic gate is relatively small. It can be understood in an abstract sense that a quantum logic gate includes more general logic gates and longer length of permutation and combination, while a basic logic gate has less general logic gates, and shorter length of the permutation and combination. A number of short basic logic gates can be used to replace the permutation and combination in the long quantum logic gate. For example, if a given permutation and combination of a quantum logic gate $U_{target}$ is HSHHHSSTTT, and there is a basic logic gate M1=HSHHHSS and a basic logic gate M2=TTT, then the $U_{target}$ is replaced by the splicing of M1M2.

In the replacement process, preference is given to longer basic logic gates in replacing the permutation and combination of the quantum logic gate $U_{target}$. Thus, a given quantum logic gate $U_{target}$ can be obtained by splicing a smaller number of basic logic gates.

In practical applications, the basic logic gates to be used to replace the quantum logic gate $U_{target}$ are used as the sub-logic gates of the quantum logic gate $U_{target}$. That is, by splicing these sub-logic gates, the quantum logic gate $U_{target}$ can be obtained.

After Step 303, Step 304A or Step 304B may be executed.

Step 304A: For each of the sub-logic gates, search for a basic logic gate corresponding to the sub-logic gate, and determine a basic pulse corresponding to the basic logic gate to be a sub-pulse corresponding to the sub-logic gate.

Step 304B: For each of the sub-logic gates, determine a search identifier according to the sub-logic gate, and search for a sub-pulse having the search identifier among the basic pulses.

In the method provided by the present embodiment, two ways are presented to search for sub-pulses among the basic pulses, which are Step 304A and Step 304B.

Further, in the method provided in the present embodiment, the basic pulses corresponding to the basic logic gates are set in advance. Specifically, the basic pulses can be generated according to the method in the prior art.

If the electronic device is a nuclear magnetic resonance (NMR) quantum system, multiple frequently used basic pulses can be prepared in advance and stored. For example, a representation matrix of a logic gate can be represented as M (a quantum logic gate is usually represented by a matrix), where M can include a component matrix for a first coordinate axis, a component matrix for a second coordinate axis and a component matrix for a third coordinate axis; and directions of the first coordinate axis, the second coordinate axis and the third coordinate axis are perpendicular to each other. For example, M=Rx(θ), M=Ry(θ), M=Rz(θ), θ∈{k/N, k=1, 2, 3 . . . }, where N is a preset value that is sufficiently large, such as 3600. It is also possible to set representation matrices for frequently used two-bit gates CNOT (Control Overturn Gate) and CZ (Control Phase Gate). Pulses corresponding to these matrices can be generated. That is, the basic pulses corresponding to the basic logic gates can be generated, where the specific generation method can adopt the prior art, and the basic pulses can be stored. For example, they can be stored in a hard disk of the electronic device, where, $$Rx(\theta) = \begin{bmatrix} \cos(\theta/2) & -i\sin(\theta/2) \\ -i\sin(\theta/2) & \cos(\theta/2) \end{bmatrix};$$

$$Ry(\theta) = \begin{bmatrix} \cos(\theta/2) & -\sin(\theta/2) \\ \sin(\theta/2) & \cos(\theta/2) \end{bmatrix};$$

$$Rz(\theta) = \begin{bmatrix} e^{-i\theta/2} & 0 \\ 0 & e^{-i\theta/2} \end{bmatrix};$$

$$CNOT = \begin{bmatrix} 1 & 0 & 0 & 0 \\ 0 & 1 & 0 & 0 \\ 0 & 0 & 0 & 1 \\ 0 & 0 & 1 & 0 \end{bmatrix};$$

$$CZ = \begin{bmatrix} 1 & 0 & 0 & 0 \\ 0 & 1 & 0 & 0 \\ 0 & 0 & 1 & 0 \\ 0 & 0 & 0 & -1 \end{bmatrix}.$$

In practical applications, it is possible to search among basic logic gates for a logic gate corresponding to a sub-logic gate. For example, if there is a basic logic gate Rx1, and a sub-logic gate Rx1 is obtained by current splitting, then the two can be considered to be in correspondence.

In an implementation, if a logic gate identical to a sub-logic gate exists among the basic logic gates, the two identical logic gates can be considered to be in correspondence. In another implementation, if a difference between a basic logic gate and a sub-logic gate falls within a preset range, the two same logic gates can be considered to be in correspondence. For example, a basic logic gate is Rx(θ1), and a currently split sub-logic gate is Rx(θ2), and if the difference between θ1 and θ2 is less than a preset threshold, it can be considered that the difference between the basic logic gate and the sub-logic gate falls within the preset range, and hence Rx(θ1) and Rx(θ2) are in correspondence.

For a basic logic gate, a corresponding pulse 'pulse' is prepared in advance. If the basic logic gate corresponds to the sub-logic gate, the basic pulse of the basic logic gate can be determined as the sub-pulse corresponding to the sub-logic gate. For example, if a basic logic gate RX (θ1) corresponds to a sub-logic gate Rx (θ2), a basic pulse 'pulse (x, θ1)' corresponding to the basic logic gate Rx (θ1) can be used as the sub-pulse for Rx (θ2).

In another implementation, a corresponding preset identifier can be set for each basic pulse. The preset identifier is determined according to a hash value generated from the matrix elements included in a representation matrix of a basic logic gate corresponding to the basic pulse.

Specifically, matrix elements in the representation matrix of the basic logic gate (the logic gate can be represented by a matrix) can be extracted, and a hash value can be determined according to a preset number of leading bits of the matrix elements. Then, the hash value can be used as the preset identifier for the basic pulse corresponding to the basic logic gate. For example, if a basic pulse pulse (x, θ1) corresponding to the basic logic gate Rx (θ1) is generated, a hash (x, θ1) can be generated according to the matrix of the logic gate Rx(θ1), and the hash (x, θ1) can be used as the preset identifier for the basic pulse (x, θ1).

Further, when searching among the basic pulses for a sub-pulse corresponding to a sub-logic gate, a search identifier may be determined according to the sub-logic gate, and the sub-pulse having the search identifier is searched for among the basic pulses. For example, if a search identifier corresponding to a sub-logic gate is hash (x, θ1), the basic pulse pulse (x, θ1) may be used as the sub-pulse corresponding to the sub-logic gate.

In practical applications, the methods for generating the search identifier and the preset identifiers for the basic pulses should be consistent. Specifically, the matrix elements can be determined according to a representation matrix of the sub-logic gate, the hash value can be generated according to the matrix elements, and the hash value can be determined to be the search identifier. For example, each element in a representation matrix of a logic gate is stored using IEEE 754, and a hash value is determined according to the first 32 bits in a stored result.

Specifically, there are cases in which no sub-pulse corresponding to a sub-logic gate can be found. In such cases, a variable θ in the sub-logic gate can be fine-tuned and the search for the corresponding sub-pulse can be continued according to the tuned sub-logic gate.

Further, in the basic logic gates, $\theta \in \{k/N, k=1, 2, 3\}$, from which it can be seen that there are many other values between two adjacent values of θ. For example, when k=1 and 2, θ is 1/N and 2/N, respectively, and there are many other values between the 1/N and 2/N.

Assuming that the θ in a sub-logic gate falls within this range, it will happen in a first implementation of searching for a sub-pulse that there will be no basic logic gate identical to the sub-logic gate. Again assuming that the θ in a sub-logic gate falls within this range and differs from any of the θ values in the basic logic gates by more than a preset threshold, it will happen that no basic logic gate can be determined to be corresponding to the sub-logic gate. Thus, in the second implementation of searching for a sub-pulse, it will happen that the search identifier generated according to the sub-logic gate cannot be matched to any of the preset identifiers of the sub-pulses, and no corresponding sub-pulse can be found.

In these cases, adjustment can be applied to the θ value in the sub-logic gate before repeating the searching step in order to find the sub-pulse corresponding to the sub-logic gate.

If an electronic device is a superconducting quantum computing system, multiple frequently used basic pulses can be prepared in advance and stored. For example, a set of quantum gates may be pre-selected, which may include three general logic gates H, S, and T. Basic pulses corresponding to the general logic gates can be generated. A variety of basic logic gates M are obtained from permutation and combination of the general logic gates. For example, by defining M=H, M=S, M=T, M=HS, M=HT, etc., the basic logic gate M can be obtained from the permutation and combination of n general logic gates. Correspondingly, pulses of the general logic gates can be arranged and combined to obtain the pulse corresponding to the basic logic gate M, where n can be, for example, 1, 2, . . . 16 or other values. The pulse of the basic logic gate M can be stored in, for example, a hard disk of the electronic device, where, $$H = \frac{1}{\sqrt{2}}\begin{bmatrix} 1 & 1 \\ 1 & -1 \end{bmatrix}; S = \begin{bmatrix} 1 & 0 \\ 0 & i \end{bmatrix}; T = \begin{bmatrix} 1 & 0 \\ 0 & e^{i\pi/4} \end{bmatrix}.$$

In an implementation, a logic gate corresponding to a sub-logic gate can be determined among the basic logic gates. In a superconducting quantum computing system, the basic logic gates can be splice to replace an original logic gate. Therefore, the basic logic gates used in the replacement are also the sub-logic gates, and the two have a corresponding relationship. The basic pulses of the basic logic gates for the replacement can be found directly in the basic pulses, and used as the sub-pulses. Assuming that the quantum logic gate $U_{target}$ is replaced by M1M2, that is, M1 and M2 (also the basic logic gates) are the sub-logic gates for $U_{target}$, then the pulses pulse(m1) and pulse(m2) corresponding to the M1 and M2 in the basic pulses can be taken as the sub-pulses.

In another implementation, a corresponding preset identifier may be set for each basic pulse. The preset identifier is determined according to a hash value generated from matrix elements included in the representation matrix of the basic logic gate corresponding to the basic pulse.

Specifically, the matrix elements in the representation matrix of the basic logic gate (the logic gate can be represented by the matrix) can be extracted, and a hash value can be determined according to a preset number of leading bits in the matrix element, and then the hash value can be used as the preset identifier of the basic pulse corresponding to the basic logic gate. For example, if the basic pulse pulse(m1) corresponding to the basic logic gate M1 is generated, a hash(m1) can be generated according to the matrix of the logic gate M1, and the hash(m1) can be used as a preset identifier for the basic pulse pulse(m1).

Further, when searching for the sub-pulses corresponding to the sub-logic gates among the basic pulses, search identifiers may be determined according to the sub-logic gates, and the sub-pulses with the search identifiers may be found among the basic pulses. For example, if a search identifier corresponding to a sub-logic gate is hash(m1), the basic pulse pulse(m1) may be used as the sub-pulse corresponding to the sub-logic gate.

In practical applications, the methods for generating the search identifier and the preset identifiers for the basic pulses should be consistent. Specifically, the matrix elements can be determined according to the representation matrix of the sub-logic gate, the hash value can be generated according to the matrix elements, and the hash value can be determined to be the search identifier. For example, each element in the representation matrix of a logic gate is stored using IEEE 754, and a hash value is determined according to the first 32 bits in the stored result.

Step 305: Manipulate the qubit according to the sub-pulses.

This step is similar to the method of manipulating the qubit in Step 202, and will not be described in detail again.

Figure 4:
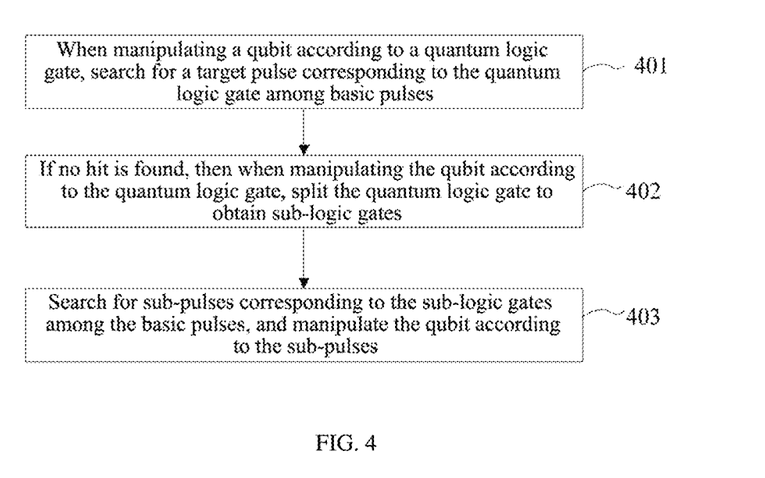
FIG. 4 is a flowchart of a quantum pulse determining method shown in a further illustrative embodiment of the present application.

FIG. 4 is a flowchart of a quantum pulse determining method shown in a further illustrative embodiment of the present application.

As shown in FIG. 4, the quantum pulse determining method provided by the present embodiment includes the following.

Step 401: When manipulating a qubit according to a quantum logic gate, search for a target pulse corresponding to the quantum logic gate among basic pulses.

The method provided by the present embodiment can be executed by an electronic device with computing capability, such as a quantum computing system, a quantum computing platform or the like.

In the method provided in the embodiment, basic pulses corresponding to basic logic gates are set in advance. The specific setting method is similar to the embodiment shown in FIG. 2 or FIG. 3, and will not be described in detail again.

When a qubit is to be manipulated according to a quantum logic gate $U_{target}$, a query can firstly be made to the basic pulses to look for a pulse corresponding to the quantum logic gate $U_{target}$. If such a pulse is found, it can be read directly and used to manipulate the qubit.

Specifically, the method for querying for a target pulse of the quantum logic gate $U_{target}$ can include:

search for a basic logic gate corresponding to the quantum logic gate $U_{target}$, and determine a basic pulse corresponding to the basic logic gate to be the target pulse corresponding to the quantum logic gate $U_{target}$.

The basic pulse has a preset identifier, and the method for querying the target pulse can also include:

determine a search identifier according to the quantum logic gate $U_{target}$, and search for a sub-pulse having the search identifier among the basic pulses.

The specific implementation is similar to searching for sub-pulses, and will not be described in detail again.

If no target pulse found, Step 402 may be executed.

Step 402: If no hit is found, then when manipulating the qubit according to the quantum logic gate, split the quantum logic gate to obtain sub-logic gates.

If no target pulse corresponding to the quantum logic gate $U_{target}$ is found, it means that no basic logic gate is corresponding to the logic gate, so the quantum logic gate $U_{target}$ needs to be split to query for corresponding sub-pulses of the sub-logic gates.

Step 403: Search for sub-pulses corresponding to the sub-logic gates among the basic pulses, and manipulate the qubit according to the sub-pulses.

The splitting method in Step 402 and the sub-pulse searching method in Step 403 are similar to those in the embodiments shown in FIG. 2 or FIG. 3, and will not be described in detail again.

Optionally, an electronic device for implementing the method provided by the present embodiment can also be provided with a multi-level memory, and a data processing speed of each level of the memory is different. In this case, when searching for the sub-pulses corresponding to the sub-logic gates among the basic pulses, the sub-pulses are read from the multi-level memory in an order of the data processing speed from fast to slow. For example, a search for a sub-pulse may begin from the fastest memory. If no hit is found, move on to the next-fastest memory. If still no hit is found, further move on to an even slower memory.

In an implementation, all the basic pulses corresponding to the basic logic gates can be initially stored in a memory with the slowest processing speed in advance.

Figure 5:
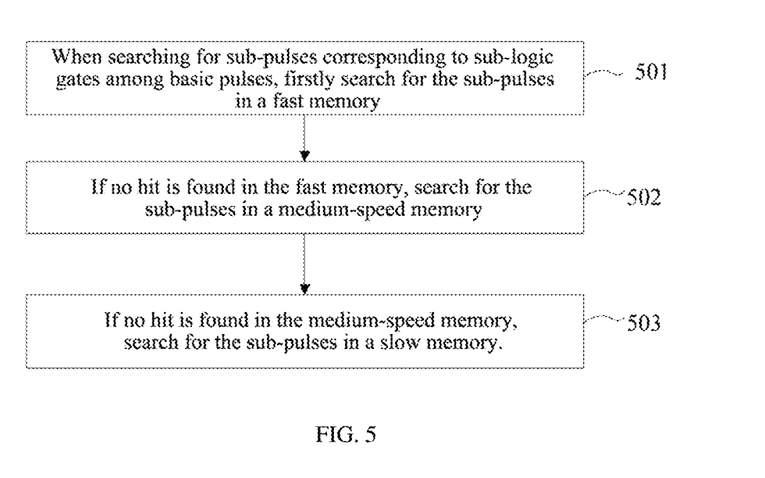
FIG. 5 is a flowchart of a pulse search method shown in an illustrative embodiment of the present application.

FIG. 5 is a flowchart of a pulse searching method shown in an illustrative embodiment of the present application.

As shown in FIG. 5, the pulse searching method provided in this embodiment includes the following.

Step 501: When searching for sub-pulses corresponding to sub-logic gates among basic pulses, firstly search for the sub-pulses in a fast memory.

Step 502: If no hit is found in the fast memory, search for the sub-pulses in a medium-speed memory.

Step 503: If no hit is found in the medium-speed memory, search for the sub-pulses in a low-speed memory.

All of the above quantum pulse determining methods need to search for pulses corresponding to the logic gates. The method provided in the present embodiment describes a specific searching process from the hardware perspective.

In a nuclear magnetic resonance quantum system, if no hit is found in any of the three memories, it can be deemed that no sub-pulse corresponding to the sub-logic gate can be found.

Figure 6:
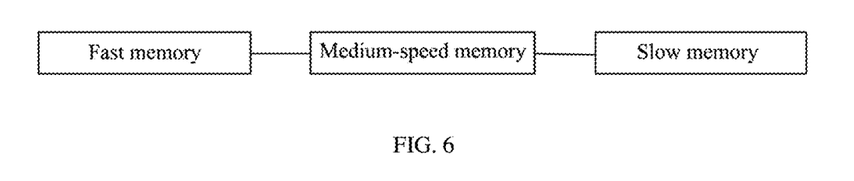
FIG. 6 is a structural diagram of a storage medium shown in an illustrative embodiment of the present application.

FIG. 6 is a structural diagram of a storage medium shown in an illustrative embodiment of the present application.

As shown in FIG. 6, an electronic device for implementing the method provided in the present embodiment is provided with a slow memory, a medium-speed memory, and a fast memory. All pre-prepared basic pulses are stored in the slow memory.

A speed of reading data from the fast memory is faster than that of the medium-speed memory, and a speed of reading data from the medium-speed memory is faster than that of the slow memory.

A specific method when searching for a sub-pulse in any memory may include:

search for a basic logic gate corresponding to a sub-logic gate, and determine a basic pulse corresponding to the basic logic gate to be a sub-pulse corresponding to the sub-logic gate.

If the basic pulse is provided with a preset identifier, the specific searching method can include:

determine a search identifier according to the sub-logic gate, and search for a sub-pulse with the search identifier among the basic pulses.

When searching for a sub-pulse corresponding to a sub-logic gate, the search may begin from the fast memory based on the aforementioned searching method. If no corresponding pulse is found, that is, no hit is found, search the medium-speed memory for the sub-pulse. If the corresponding pulse is still not found in the medium-speed memory, that is, no hit is found, search the slow memory for the sub-pulse.

Since a most comprehensive set of basic pulses is stored in the slow memory, a required pulse can be obtained therefrom.

It needs to be noted that the pulse searching method provided in the present embodiment is also applicable to Step 401 in the embodiment shown in FIG. 4, to search for a target pulse corresponding to the logic gate in the basic pulse.

Correspondingly, the above steps may be adaptively changed to the following.

Step 501': When searching for a target pulse corresponding to the quantum logic gate among the basic pulses, firstly search for the target pulse in the fast memory.

Step 502': If not hit is found in the fast memory, search the medium-speed memory for the target pulse.

Step 503': If not hit is found in the medium-speed memory, search the slow memory for the target pulse.

If no hit for the target pulse is found in any of the three storage media, Step 402 is executed.

On the basis of the above embodiments, if a hit is found for a sub-pulse in the slow memory, the sub-pulse will be migrated to the medium-speed memory; if a hit is found for a sub-pulse in the medium-speed memory, the sub-pulse will be migrated to the fast memory. In this way, basic pulses with higher probabilities of being read can be stored in the memory with a faster data reading speed, and pulses needed can be found more quickly when the pulses are read later.

This method can also be applied to the method for reading a target pulse, and the specific implementation is similar to the above, which will not be described in detail.

Optionally, in the medium-speed memory and fast memory, the number or time of access corresponding to each basic pulse can be recorded. When the medium-speed memory or fast memory reaches an upper limit of capacity, the basic pulses stored therein can be refreshed according to the number or time of access. For example, a basic pulse with the least number of assess will be deleted. For another example, a basic pulse with an earlier access time is deleted. Thus, the basic pulses stored in the medium-speed memory and fast memory are more likely to be read again, so as to improve the pulse reading speed and further improve the running speed of the quantum computing system.

Figure 7:
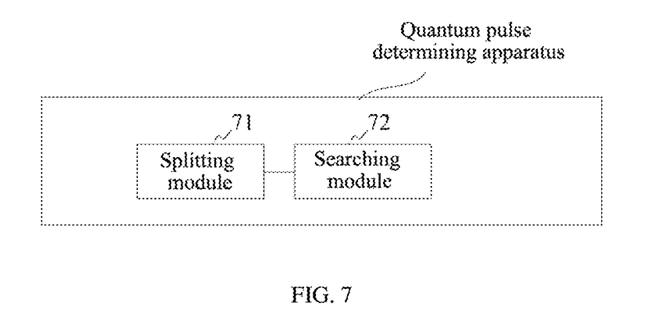
FIG. 7 is a structural diagram of a quantum pulse determining apparatus shown in an illustrative embodiment of the present application.

FIG. 7 is a structural diagram of a quantum pulse determining apparatus shown in an illustrative embodiment of the present application.

As shown in FIG. 7, the quantum pulse determining apparatus provided in the present embodiment is preset with basic pulses corresponding to basic logic gates;

the apparatus including:

a splitting module 71, configured to split a quantum logic gate to obtain sub-logic gates when manipulating on a qubit according to the quantum logic gate;

a searching module 72, configured to search for sub-pulses corresponding to the sub-logic gates among the basic pulses, and manipulate the qubit according to the sub-pulses.

The quantum pulse determining apparatus provided in the present embodiment is provided with basic pulses corresponding to basic logic gates in advance, the apparatus including a splitting module, configured to split the quantum logic gate to obtain sub-logic gates when manipulating on a qubit according to the quantum logic gate; a searching module, configured to search for sub-pulses corresponding to the sub-logic gates among the basic pulses, and manipulate the qubit according to the sub-pulses. In the quantum pulse determining apparatus, basic pulses are set in advance. When manipulating a qubit, the quantum logic gate to be used can be split into multiple sub-logic gates, and then sub-logic pulses corresponding to the sub-logic gates can be searched for among the basic pulses. The sub-pulses thus read can be used directly to manipulate the qubit, which can avoid the computing power consumed in generating pulses according to the quantum logic gate, so as to improve an operation speed of the quantum computing system.

Figure 8:
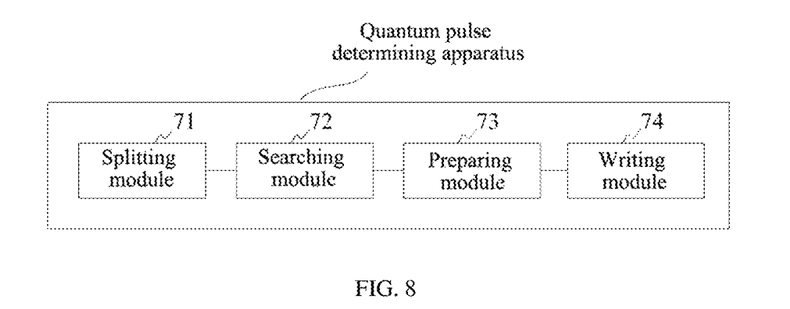
FIG. 8 is a structural diagram of a quantum pulse determining apparatus shown in another illustrative embodiment of the present application.

FIG. 8 is a structural diagram of a quantum pulse determining apparatus shown in another illustrative embodiment of the present application.

Optionally, as shown in FIG. 8, on the basis of the foregoing embodiments, in the quantum pulse determining apparatus provided in the present embodiment, the searching module 72 is specifically configured to:

for each of the sub-logic gates, search for a basic logic gate corresponding to the sub-logic gate, and determine a basic pulse corresponding to the basic logic gate to be a sub-pulse corresponding to the sub-logic gate.

Optionally, the basic pulse has a preset identifier; and
the searching module 72 is specifically configured to:
for each of the sub-logic gates, determine a search identifier according to the sub-logic gate, and search for a sub-pulse having the search identifier among the basic pulses.

Optionally, the preset identifier is determined according to matrix elements included in a representation matrix of the basic logic gate corresponding to the preset identifier; and correspondingly, the searching module 72 is specifically configured to:

determine matrix elements according to a representation matrix of the sub-logic gate, generate a hash value according to the matrix elements, and determine the hash value to be the search identifier.

Optionally, if a quantum computing system is a nuclear magnetic resonance quantum system, the splitting module 71 is specifically configured to:

split the quantum logic gate, based on a rotation decomposition algorithm, into sub-logic gates: a first coordinate axis sub-gate, a second coordinate axis sub-gate and a third coordinate axis sub-gate.

Optionally, representation matrices of the first coordinate axis sub-gate, the second coordinate axis sub-gate, and the third coordinate axis sub-gate are functions of a variable θ;

if the searching module 72 cannot found any sub-pulse corresponding to the sub-logic gates, the variable θ is adjusted, and a step of the searching for the sub-pulses corresponding to the sub-logic gates among the basic pulses is repeated.

Optionally, a representation matrix of the basic logic gate includes any one of the following:

a component matrix for a first coordinate axis, a component matrix for a second coordinate axis, and a component matrix for a third coordinate axis, where directions of the first coordinate axis, the second coordinate axis, and the third coordinate axis are perpendicular to each other.

Optionally, if the quantum computing system is a superconducting quantum system, the splitting module 71 is specifically configured to:

convert the quantum logic gate into a permutation and combination of multiple general logic gates based on a preset algorithm; and utilize at least one of the basic logic gates to replace the permutation and combination of the general logic gates to obtain the sub-logic gates.

Optionally, the preset algorithm is a single bit decomposition algorithm.

Optionally, the apparatus further includes a preparing module 73 to:

generate general pulses corresponding to the general logic gates in advance;

obtain the basic logic gates by permutating and combining the general logic gates, and generate the basic pulses corresponding to the basic logic gates according to the general pulses corresponding to the general logic gates.

Optionally, before splitting the quantum logic gate to obtain the sub-logic gates, the splitting module 71 is further configured to:

search for a target pulse corresponding to the quantum logic gate among the basic pulses, and if no hit is found, execute the step of splitting the quantum logic gate to obtain sub-logic gates.

Optionally, a multi-level memory is provided; and a data processing speed of each level of the memory is different; and when searching for the sub-pulses corresponding to the sub-logic gates among the basic pulses, the searching module 72 reads the sub-pulses from the multi-level memory in an order of the data processing speed from fast to slow.

The multi-level memory includes a slow memory, a medium-speed memory, and a fast memory; the slow memory stores the basic pulses corresponding to all of the basic logic gates; and the searching module 72 is specifically configured to:
firstly, search for the sub-pulses in the fast memory;
if no hit is found in the fast memory, search for the sub-pulses in the medium-speed memory; and
if no hit is found in the medium-speed memory, search for the sub-pulses in the slow memory.

Optionally, the apparatus further includes a writing module 74, configured to:

if a hit is found for the sub-pulses in the slow memory, store the sub-pulses in the medium-speed memory;

if a hit is found for the sub-pulses in the medium-speed memory, store the sub-pulses in the fast memory.

According to the embodiments of the present application, the present application also provides an electronic device and a readable storage medium.

Figure 9:
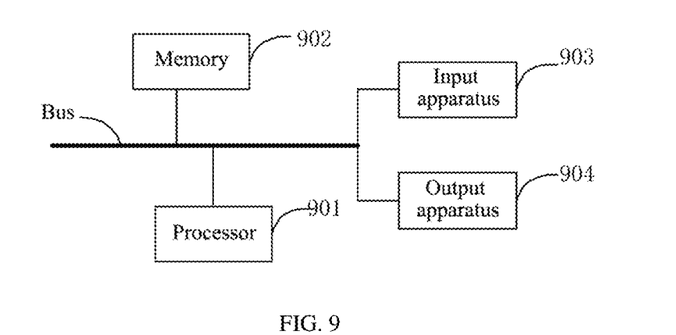
FIG. 9 is a structural diagram of an electronic device shown in an illustrative embodiment of the present application.

Shown in FIG. 9 is a block diagram of an electronic device according to the method of the embodiment of the present application. An electronic device is intended to represent various forms of digital computers, such as laptop computers, desktop computers, workstations, personal digital assistants, servers, blade servers, mainframe computers, and other appropriate computers. Electronic devices can also represent various forms of mobile devices, such as personal digital processing, cellular phones, smart phones, wearable devices, and other similar computing devices. As shown herein, the components as well as the connections, relationships, and functions thereof are merely examples, and are not intended to limit an implementation of the present application described and/or claimed herein.

As shown in FIG. 9, the electronic device includes: one or more processors 901, a memory 902, and interfaces for connecting various components, including a high-speed interface and a low-speed interface. The various components are connected to each other via different buses, and can be installed on a common mainboard or in other ways as needed. The processor can process instructions executed in the electronic device, including the instructions stored in or on memory to display graphical information of a GUI on an external input/output device, such as a display device coupled to the interface. In other embodiments, multiple processors and/or multiple buses may be used with multiple memories and multiple memories if required. Similarly, multiple electronic devices can be connected, with each device providing part of the necessary functions (for example, as a server array, a group of blade servers, or a multi-processor system). In FIG. 9, a processor 901 is shown as an example.

The memory 902 is a non-transitory computer-readable storage medium provided by the present application. The memory stores instructions that can be executed by at least one processor to cause the at least one processor to execute a quantum pulse determining method provided by the present application. The non-transitory computer-readable storage medium of the present application stores computer instructions for causing the computer to execute the quantum pulse determining method provided by the present application.

As a non-transitory computer-readable storage medium, the memory 902 can be used to store non-transitory software programs, non-transitory computer executable programs and modules, such as program instructions/modules corresponding to the quantum pulse determining method in the embodiments of the present application (for example, the splitting module 71 and the searching module 72 shown in FIG. 7). By running the non-transitory software programs, the instructions and the modules stored in the memory 902, the processor 901 executes various functional applications and data processing of the server, that is, the quantum pulse determination method in the method embodiment is realized.

The memory 902 may include a storage program area and a storage data area, where the storage program area may store an operating system and an application program required by at least one function. The storage data area may store data created according to the use of electronic devices, and the like. In addition, the memory 902 may include a high-speed random-access memory, and may also include a non-transitory memory, such as at least one magnetic disk storage device, a flash memory device, or other non-transitory solid-state storage devices. In some embodiments, the memory 902 may be choose as include memories set remotely relative to the processor 901, and these remote memories may be connected to the electronic device through a network. Examples of the above network include but are not limited to the Internet, intranet, local area network, mobile communication network, and combinations thereof.

The electronic device may further include: an input apparatus 903 and an output apparatus 904. The processor 901, the memory 902, the input apparatus 903, and the output apparatus 904 may be connected by a bus or in other ways. In FIG. 9, connection through a bus is used as an example.

The input apparatus 903 can receive input digital or character information and generate key signal input related to user settings and function control of electronic device, such as a touch screen, a keyboard, a mouse, a track pad, a touch pad, an indicator bar, one or more mouse buttons, a trackball, a joystick, etc. The output apparatus 904 may include a display device, an auxiliary lighting apparatus (e.g., a LED), a tactile feedback apparatus (e.g., a vibration motor), etc. The display device may include, but is not limited to, a liquid crystal display (LCD), a light emitting diode (LED) display and a plasma display. In some embodiments, the display device may be the touch screen.

Various embodiments of the systems and techniques described herein may be achieved in digital electronic circuit systems, integrated circuit systems, dedicated ASICs (Application Specific Integrated Circuits, ASIC), computer hardware, firmware, software, and/or combinations thereof. These various embodiments can include: implemented in one or more computer programs which can be executed and/or interpreted on a programmable system including at least one programmable processor. The programmable processor may be a dedicated or a general programmable processor, and may receive data and instructions from a storage system, at least one input apparatus and at least one output apparatus, and transmit the data and instructions to the storage system, the at least one input apparatus and the at least one output apparatus.

These computing programs (also called programs, software, software applications, or codes) include machine instructions of the programmable processors, and can be implemented using high-level process and/or object-oriented programming languages, and/or assembly/machine languages. As used herein, the term "machine-readable medium" and "computer-readable medium" refer to any computer program product, device, and/or apparatus for providing machine instructions and/or data to the programmable processor (e.g., disk, optical disk, memory, programmable logic device (PLD)), including a machine-readable medium that receive machine instructions as machine-readable signals. The term "machine-readable signal" refers to any signal used to provide machine instructions and/or data to the programmable processor.

In order to provide an interaction with a user, the systems and technologies described herein may be implemented on a computer having: a display device for displaying information to the user (e.g., CRT (Cathode Ray Tube, CRT) or LCD (Liquid Crystal Display, LCD) monitor); and a keyboard and a pointing apparatus (for example, the mouse or the trackball), the user can use the keyboard and the pointing apparatus to provide input to the computer. Other kinds of apparatus can also be used to provide interaction with the user; for example, a feedback provided to the user can be any form of sensing feedback (e.g., visual feedback, auditory feedback, or tactile feedback); and can use any form (including acoustic input, voice input, or tactile input) to receive input from the user.

The systems and technologies described herein may be implemented in a computing system including back-end components (e.g., as a data server), or a computing system including middleware components (e.g., an application server), or a computing system including front-end components (e.g., a user computer with a graphical user interface or a web browser, through which the user can interact with the embodiment of the systems and technologies described herein), or include such back-end components, middleware components, or any combination of front-end components in the computing system. The components of the system can be interconnected by any form or medium of digital data communication (e.g., communication network). Examples of the communication networks include: a local area network (LAN), a wide area network (WAN) and the Internet.

The computer system may include a client and a server. The client and server are generally far away from each other and usually interact through the communication network. A relationship between the client and the server is generated by computer programs that run on corresponding computers and have a client-server relationship with each other.

It should be understood various forms of processes shown above can be used to reorder, add, or delete steps. For example, the steps recorded in the present application can be executed in parallel, in sequence or in different orders. As long as expected results of the technical solution disclosed by the present application can be realized, no limitation is made herein.

The above specific embodiments do not constitute any limitation on the protection scope of the present application. Those skilled in the art should understand that various modifications, combinations, sub-combinations and substitutions can be made according to design requirements and other factors. Any modification, equivalent replacement and improvement made within the spirit and principle of the present application shall be included in the protection scope of the present application.

What is claimed is:

1. A quantum pulse determining method, wherein basic pulses corresponding to basic logic gates are set in advance, and the method comprises:
  when manipulating a qubit according to a quantum logic gate, splitting the quantum logic gate to obtain sub-logic gates; and
  searching for sub-pulses corresponding to the sub-logic gates among the basic pulses, and manipulating the qubit according to the sub-pulses;
  wherein each of the basic pulses has a preset identifier; and
  the searching for sub-pulses corresponding to the sub-logic gates among the basic pulses comprises:
  for each of the sub-logic gates, determining a search identifier according to the sub-logic gate, and searching for a sub-pulse having the search identifier among the basic pulses.

2. The quantum pulse determining method according to claim 1, wherein
  the preset identifier is determined according to a hash value generated according to matrix elements comprised in a representation matrix of a basic logic gate corresponding to the preset identifier; and
  correspondingly, the determining a search identifier according to the sub-logic gate comprises:

determining matrix elements according to a representation matrix of the sub-logic gate, generating a hash value according to the matrix elements, and determining the hash value to be the search identifier.

3. The quantum pulse determining method according to claim 1, wherein when a quantum computing system is a nuclear magnetic resonance quantum system, the splitting the quantum logic gate to obtain sub-logic gates comprises:
  splitting the quantum logic gate, based on a rotation decomposition algorithm, into sub-logic gates: a first coordinate axis sub-gate, a second coordinate axis sub-gate and a third coordinate axis sub-gate;
  wherein representation matrices of the first coordinate axis sub-gate, the second coordinate axis sub-gate and the third coordinate axis sub-gate are functions of a variable θ; and
  when no sub-pulses corresponding to the sub-logic gates is found, adjusting the variable θ, and continuing to execute the step of searching for sub-pulses corresponding to the sub-logic gates among the basic pulses.

4. The quantum pulse determining method according to claim 1, wherein when a quantum computing system is a superconducting quantum system, the splitting the quantum logic gate to obtain sub-logic gates comprises:
  converting the quantum logic gate into a permutation and combination of multiple general logic gates based on a preset algorithm;
  utilizing at least one of the basic logic gates to replace the permutation and combination of the multiple general logic gates to obtain the sub-logic gates;
  and the method further comprises:
  generating general pulses corresponding to the general logic gates in advance; and
  obtaining the basic logic gates by permutating and combining the general logic gates, and generating the basic pulses corresponding to the basic logic gates according to the general pulses corresponding to the general logic gates.

5. An electronic device, wherein basic pulses corresponding to basic logic gates are provided in advance; and
  the electronic device comprises a processor and a memory connect in communication with at least one processor, wherein the memory stores instructions, and the processor, when executing the instructions, is configured to:
  split a quantum logic gate to obtain sub-logic gates when manipulating a qubit according to the quantum logic gate;
  search for sub-pulses corresponding to the sub-logic gates among the basic pulses, and manipulate the qubit according to the sub-pulses;
  wherein each of the basic pulses has a preset identifier; and
  the processor is configured to:
  for each of the sub-logic gates, determine a search identifier according to the sub-logic gate, and search for a sub-pulse having the search identifier among the basic pulses.

6. The electronic device according to claim 5, wherein the preset identifier is determined according to a hash value generated according to matrix elements comprised in a representation matrix of a basic logic gate corresponding to the preset identifier;
  correspondingly, the processor is configured to:
  determine matrix elements according to a representation matrix of the sub-logic gate, generate a hash value according to the matrix elements, and determine the hash value to be the search identifier.

7. The electronic device according to claim 5, wherein when a quantum computing system is a nuclear magnetic resonance quantum system, the processor is configured to:
  split the quantum logic gate, based on a rotation decomposition algorithm, into sub-logic gates: a first coordinate axis sub-gate, a second coordinate axis sub-gate and a third coordinate axis sub-gate.

8. The electronic device according to claim 7, wherein, representation matrices of the first coordinate axis sub-gate, the second coordinate axis sub-gate and the third coordinate axis sub-gate are functions of a variable θ;
  when the processor cannot search any sub-pulses corresponding to the sub-logic gates, the processor adjusts the variable θ, and continues to execute the step of searching sub-pulses corresponding to the sub-logic gates among the basic pulses.

9. The electronic device according to claim 7, wherein a representation matrix of a basic logic gate comprises any of the following:
  a component matrix for a first coordinate axis, a component matrix for a second coordinate axis, and a component matrix for a third coordinate axis; wherein directions of the first coordinate axis, the second coordinate axis and the third coordinate axis are perpendicular to each other.

10. The electronic device according to claim 5, wherein when a quantum computing system is a superconducting quantum system, the processor is configured to:
  convert the quantum logic gate into a permutation and combination of multiple general logic gates based on a preset algorithm;
  utilize at least one of the basic logic gates to replace the permutation and combination of the multiple general logic gates to obtain the sub-logic gates.

11. The electronic device according to claim 10, wherein the preset algorithm is a single bit decomposition algorithm.

12. The electronic device according to claim 10, wherein the processor further configured to:
  generate general pulses corresponding to the general logic gates in advance;
  obtain the basic logic gates by permutating and combining the general logic gates, and generate the basic pulses corresponding to the basic logic gates according to the general pulses corresponding to the general logic gates.

13. The electronic device according to claim 5, wherein before splitting the quantum logic gate to obtain the sub-logic gates, the processor is further configured to:
  search for a target pulse corresponding to the quantum logic gate among the basic pulses, and when no hit is found, execute the step of splitting the quantum logic gate to obtain sub-logic gates.

14. The electronic device according to claim 5, wherein a device provided with the electronic device is provided with a multi-level memory; and a data processing speed of each level of the memory is different; and
  when searching for sub-pulses corresponding to the sub-logic gates among the basic pulses, the processor reads the sub-pulses from the multi-level memory in an order of the data processing speed from fast to slow.

15. The electronic device according to claim 14, wherein the multi-level memory comprises a slow memory, a medium-speed memory and a fast memory; the slow memory stores basic pulses corresponding to all of the basic logic gates; and the processor is configured to:
search for the sub-pulses in the fast memory;
when no hit is found in the fast memory, search for the sub-pulses in the medium-speed memory; and
when no hit is found in the medium-speed memory, search for the sub-pulses in the slow memory.

16. The electronic device according to claim 15, wherein the processor is further configured to:
when a hit is found for the sub-pulses in the slow memory, store the sub-pulses in the medium-speed memory;
when a hit is found for the sub-pulses in the medium-speed memory, store the sub-pulses in the fast memory.

17. The quantum pulse determining method according to claim 3, wherein a representation matrix of a basic logic gate comprises any one of the following:
a component matrix for a first coordinate axis, a component matrix for a second coordinate axis, and a component matrix for a third coordinate axis, wherein directions of the first coordinate axis, the second coordinate axis and the third coordinate axis are perpendicular to each other.

18. The quantum pulse determining method according to claim 1, wherein before the splitting the quantum logic gate to obtain sub-logic gates, the method further comprises:
searching for a target pulse corresponding to the quantum logic gate among the basic pulses, and when no hit is found, executing the step of splitting the quantum logic gate to obtain sub-logic gates.

19. The quantum pulse determining method according to claim 1, wherein a multi-level memory is provided, and a data processing speed of each level of the memory is different; and
when searching for sub-pulses corresponding to the sub-logic gates among the basic pulses, reading the sub-pulses from the multi-level memory in an order of the data processing speed from fast to slow.

20. A non-transitory computer-readable storage medium storing computer instructions, wherein the computer instructions are used to cause a computer to execute the method according to claim 1.

* * * * *